United States Patent
Yin et al.

(10) Patent No.: US 10,101,411 B2
(45) Date of Patent: Oct. 16, 2018

(54) ANTI-STATIC CIRCUIT AND ELECTRONIC DEVICE USING THE SAME

(71) Applicants: HONGFUJIN PRECISION ELECTRONICS (ZHENGZHOU) CO., LTD., Zhengzhou (CN); HON HAI PRECISION INDUSTRY CO., LTD., New Taipei (TW)

(72) Inventors: Ji-Xiang Yin, Henan (CN); Jiang-Feng Shan, Henan (CN); Tsung-Jen Chuang, New Taipei (TW)

(73) Assignees: HONGFUJIN PRECISION ELECTRONICS (ZHENGZHOU) CO., LTD., Zhengzhou (CN); HON HAI PRECISION INDUSTRY CO., LTD., New Taipei (TW)

( * ) Notice: Subject to any disclaimer, the term of this patent is extended or adjusted under 35 U.S.C. 154(b) by 350 days.

(21) Appl. No.: 15/142,625

(22) Filed: Apr. 29, 2016

(65) Prior Publication Data

US 2017/0215264 A1    Jul. 27, 2017

(30) Foreign Application Priority Data

Jan. 22, 2016    (CN) .......................... 2016 1 0042568

(51) Int. Cl.
*H02H 9/00* (2006.01)
*G01R 33/07* (2006.01)
*H05K 9/00* (2006.01)

(52) U.S. Cl.
CPC ........... *G01R 33/07* (2013.01); *H05K 9/0067* (2013.01)

(58) Field of Classification Search
CPC ..................................................... G01R 33/07
See application file for complete search history.

(56) References Cited

U.S. PATENT DOCUMENTS

| | | | | |
|---|---|---|---|---|
| 4,021,728 A * | 5/1977 | Makino | ................. | B82Y 25/00 324/235 |
| 4,712,648 A * | 12/1987 | Mattes | ................. | G01L 9/0089 184/6.4 |
| 7,368,918 B2 * | 5/2008 | Henson | ................ | H02H 1/0015 324/536 |
| 8,957,631 B2 * | 2/2015 | Ramsesh | .............. | G01D 5/2013 320/108 |

* cited by examiner

*Primary Examiner* — Stephen W Jackson
(74) *Attorney, Agent, or Firm* — ScienBiziP, P.C.

(57) ABSTRACT

A circuit removing static electricity from a connected electronic device includes a detecting device, an amplifier, a switch device, and a control device. The detecting device detects a change of a magnetic flux surrounding the electronic device, and generates an analog electronic signal accordingly. The amplifier connects to the detecting device and amplifies the analog electronic signal. The control device connects to the amplifier, filters an amplified analog electronic signal, and generates a control signal. The switch device connected to the control device as well as the electronic device conducts the static electricity to earth in response to the control signal.

14 Claims, 2 Drawing Sheets

ANTI-STATIC CIRCUIT AND ELECTRONIC DEVICE USING THE SAME

CROSS-REFERENCE TO RELATED APPLICATIONS

This application claims priority to Chinese Patent Application No. 201610042568.9 filed on Jan. 22, 2016, the contents of which are incorporated by reference herein.

FIELD

The subject matter herein generally relates to protective circuits, and more particularly to a circuit which can remove static electricity from an electronic device and an electronic device using the same.

BACKGROUND

Static electricity is an imbalance of electric charges within or on the surface of a material. The electrical charge remains until it is able to move away by means of an electric current or electrical discharge. However, a discharge of static electricity can cause damage to electronic components of electronic devices.

BRIEF DESCRIPTION OF THE DRAWINGS

Implementations of the present disclosure will now be described, by way of example only, with reference to the attached figures.

DETAILED DESCRIPTION

Figure 1:
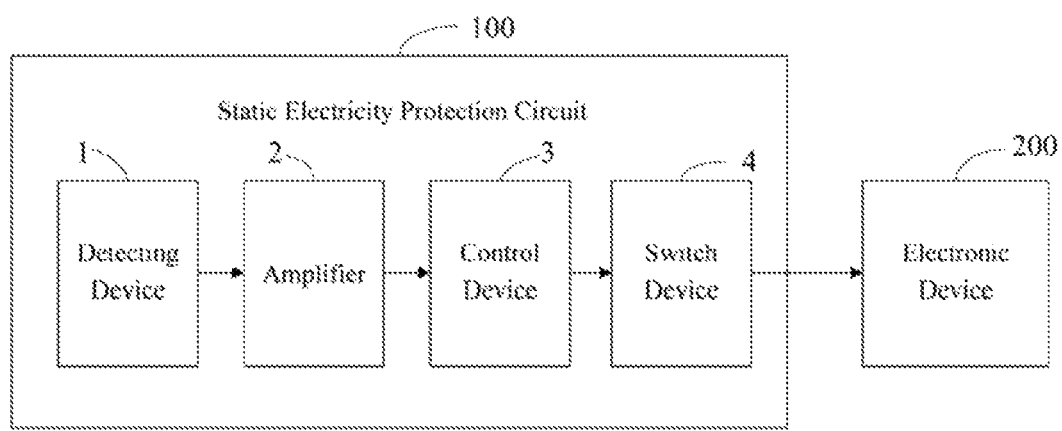
FIG. 1 is a block diagrammatic view of one embodiment of a static electricity protection circuit and an electronic device using the same.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features. The present disclosure, including the accompanying drawings, is illustrated by way of examples and not by way of limitation.

Several definitions that apply throughout this disclosure will now be presented.

References to "a/an" or "one" embodiment in this disclosure are not necessarily to the same embodiment, and such references mean "at least one." The term "comprising" means "including, but not necessarily limited to"; it specifically indicates open-ended inclusion or membership in a so-described combination, group, series and the like.

FIG. 1 illustrates a static electricity protection circuit. The static electricity protection circuit 100 can connect to an electronic device 200 and can remove static electricity from the electronic device 200. Static electricity can be generated on the electronic device 200 when a magnetic flux surrounding the electronic device 200 is changed. The static electricity protection circuit 100 can conduct the generated static electricity to earth and so avoid damage to electronic components of the electronic device 200 by the static electricity.

The static electricity protection circuit 100 can include a detecting device 1, an amplifier 2, a control device 3, and a switch device 4.

The detecting device 1 can detect a change of the magnetic flux surrounding the electronic device 200, and further can generate an analog electronic signal according to the change of the magnetic flux detected by the detecting device 1. In the embodiment, the detecting device 1 can be a magnetic field sensor, or a Hall sensor. The analog electronic signal generated by the detecting device 1 can be an analog voltage signal or an analog current signal.

The amplifier 2 connects to the detecting device 1. The amplifier 2 can amplify the analog electronic signal generated by the detecting device 1. The control device 3 connects to the amplifier 2. The control device 3 can filter the analog electronic signal amplified by the amplifier 2, and further can generate a control signal according to the filtered analog electronic signal. The switch device 4 connects to the control device 3 and the electronic device 200. The switch device 4 can conduct the generated static electricity to earth in response to the control signal generated by the control device 3. In the embodiment, the electronic device 200 can be, but is not limited to being, a mobile phone, a tablet, or a personal computer.

Figure 2:
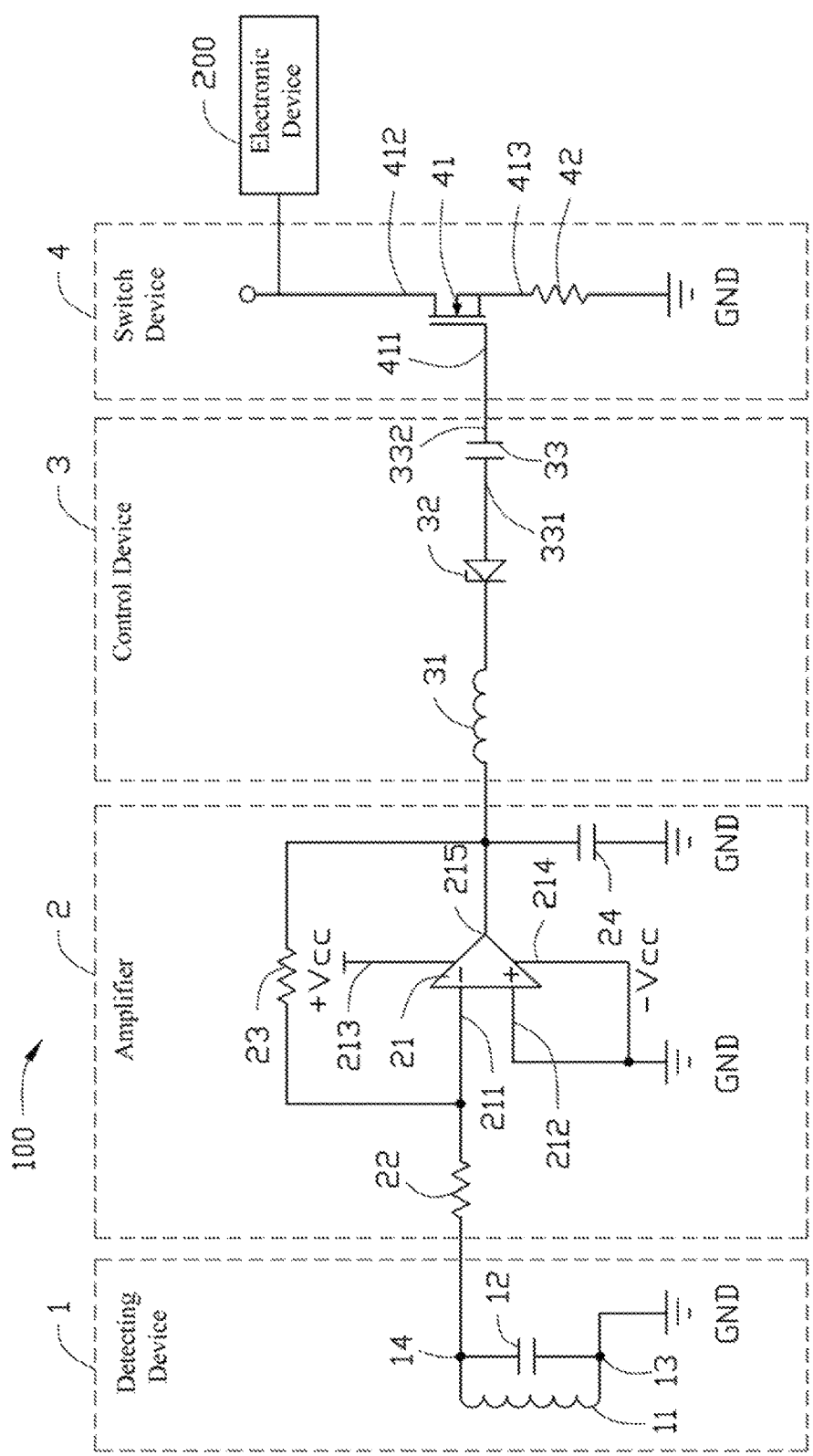
FIG. 2 is a circuit diagram of one embodiment of the static electricity protection circuit of FIG. 1.

FIG. 2 shows a circuit diagram of one embodiment of the static electricity protection circuit 100. The detecting device 1 includes a first inductor 11 and a first capacitor 12. The first inductor 11 connects to the first capacitor 12 in parallel to form a first common port 13 and a second common port 14. The first common port 13 connects to a ground (GND) port. The first inductor 11 and the first capacitor 12 can detect a change of the magnetic flux surrounding the electronic device 200 and generate a first induced voltage Vi. The first induced voltage Vi is outputted via the second common port 14.

The amplifier 2 includes an operational amplifier 21, a first resistance 22, a second resistance 23, and a second capacitor 24. The operational amplifier 21 includes a reverse input port 211, a positive input port 212, a positive power input port 213, a reverse power input port 214, and an output port 215. The first resistance 22 connects to the second common port 14 of the detecting device 1 and to the reverse input port 211 of the operational amplifier 21. That is, the reverse input port 211 of the operational amplifier 21 can receive the first induced voltage Vi which is output by the second common port 14 of the detecting device 1. The second resistance 23 connects to the reverse input port 211 and to the output port 215 of the operational amplifier 21. The positive input port 212 and the reverse power input port 214 both connect to the GND port. In the embodiment, the positive power input port 213 connects to a direct-current (DC) power supply (not shown in FIGS). The DC power supply can supply power to the positive power input port 213. In other embodiments, the positive power input port 213 connects to the electronic device 200 and receives power supplied by a power supply of the electronic device 200. The output port 215 connects to one end of the second capacitor 24. Another end of the second capacitor 24 connects to the GND port. The operational amplifier 21 amplifies the first induced voltage Vi output by the reverse input port 211, generates an output voltage Vo, and outputs the output voltage Vo via the output port 215. In the embodiment, a magnification of the output voltage Vo to the first induced voltage Vi can be determined according to formula K=R2/R1, wherein K denotes the magnification factor of the operational amplifier 21, R2 denotes the value of the second resistance 23, and R1 denotes the value of the first resistance 22. For example, if R2=100$^{kΩ}$ and R1=10$^{kΩ}$, then the magnification by the operational amplifier 21 is 10 times according to the above formula K=100/10. That is, the operational amplifier 21 amplifies the first induced voltage Vi output by the second common port 14 10 times. The value of the first resistance 22 (R1) and the second resistance 23 (R2) can be set according to a need magnification of the operational amplifier 21.

The control device 3 includes a second inductor 31, a zener diode 32, and a third capacitor 33. The second inductor 31, the zener diode 32, and the third capacitor 33 are connected to each other in series and in that order. The third capacitor 33 includes a first port 331 and a second port 332. The output port 215 of the operational amplifier 21 connects to the second inductor 31. The second inductor 31 connects to a cathode of the zener diode 32. An anode of the zener diode 32 connects to the first port 331 of the third capacitor 33. The second inductor 31 cooperates with the second capacitor 24 to filter out any clutter contained in the output voltage Vo from the amplifier 2. The second inductor 31 can generate a second induced voltage Ve and a third induced voltage Vii as an effect of the output voltage Vo to the second inductor 31, wherein Vii=Vo+Ve. A control voltage Vc is generated via the third capacitor 33 after the third induced voltage Vii is filtered via the zener diode 32. The switch device 4 can turn on in response to the control voltage Vc, wherein Vc=Vii=Vo+Ve. In the embodiment, the value of the third capacitor 33 can be 0.1 uF.

The switch device 4 includes a field effect transistor (FET) 41 and a third resistance 42. The FET 41 includes a gate port 411, a drain port 412, and a source port 413. The gate port 411 connects to the second port 332 of the third capacitor 33. The source port 413 connects to the third resistance 42. The third resistance 42 connects to the GND port. The drain port 412 connects to the electronic device 200. The control voltage Vc generated by the control device 3 has an effect upon the gate port 411, to permit conduction between the drain port 412 and the source port 413. The conduction between the drain port 412 and the source port 413 conducts the static electricity of the electronic device 200 to the GND port. In the embodiment, the control voltage Vc is larger than a threshold voltage of the gate port 411 of the FET 41. In the embodiment, the FET 41 is a metal oxide semiconductor FET.

The embodiments shown and described above are only examples. Even though numerous characteristics and advantages of the present technology have been set forth in the foregoing description, together with details of the structure and function of the present disclosure, the disclosure is illustrative only, and changes can be made in the detail, including in particular the matters of shape, size, and arrangement of parts within the principles of the present disclosure, up to and including the full extent established by the broad general meaning of the terms used in the claims.

What is claimed is:

1. A circuit removing static electricity from a connected electronic device, comprising:
    a detecting device configured to detect a change of a magnetic flux surrounding the electronic device, and generating an analog electronic signal according to a detected change of the magnetic flux;
    an amplifier connecting to the detecting device, for amplifying the analog electronic signal generated by the detecting device;
    a control device connecting to the amplifier, configured to filter an amplified analog electronic signal and generate a control signal according to a filtered analog electronic signal; and
    a switch device connected to the control device and the electronic device, configured to conduct the static electricity generated by the electronic device to earth in response to the control signal generated by the control device.

2. The circuit of claim 1, wherein the detecting device comprises a first inductor and a first capacitor; the first inductor connects to the first capacitor in parallel to form a first common port and a second common port, the first common port connects to a GND port; the first inductor and the first capacitor detect the change of the magnetic flux surrounding the electronic device and generate a first induced voltage; and the first induced voltage is outputted via the second common port.

3. The circuit of claim 2, wherein the amplifier comprises an operational amplifier, a first resistance, a second resistance, and a second capacitor; the operational amplifier comprises a reverse input port, a positive input port, a positive power input port, a reverse power input port, and an output port; the first resistance connects to the second common port and the reverse input port; the second resistance connects to the reverse input port and the output port; the output port connects to the second capacitor; and the second capacitor connects to the GND port.

4. The circuit of claim 3, wherein the control device comprises a second inductor, a zener diode, and a third capacitor; the third capacitor comprises a first port and a second port; the output port connects to the second inductor; the second inductor connects to a zener diode cathode; a zener diode anode connects to the first port; and the third capacitor is configured to generate a control voltage, and the control voltage is the control signal.

5. The circuit of claim 4, wherein the switch device comprises a FET and a third resistance; the FET comprises a gate port, a drain port, and a source port; the gate port connects to the second port; the source port connects to the third resistance; the third resistance connects to the GND port; the drain port connects to the electronic device; and the drain port and the source port are conducted in response to the control voltage.

6. The circuit of claim 1, wherein the detecting device is a magnetic field sensor, or a Hall sensor.

7. The circuit of claim 1, wherein the analog electronic signal is an analog voltage signal or an analog current signal.

8. An electronic device, comprising a circuit removing static electricity from the electronic device, the circuit comprising:
    a detecting device configured to detect a change of a magnetic flux surrounding the electronic device, and generate an analog electronic signal according to a detected change of the magnetic flux, wherein the electronic device connects to the circuit;
    an amplifier connecting to the detecting device, configured to amplify the analog electronic signal;
    a control device connecting to the amplifier, configured to filter a amplified analog electronic signal and generate a control signal according to a filtered analog electronic signal; and a switch device connecting to the control device and the electronic device, configured to conduct the static electricity generated by the electronic device to earth in response to the control signal.

9. The electronic device of claim 8, wherein the detecting device comprises a first inductor and a first capacitor; the first inductor connects to the first capacitor in parallel to form a first common port and a second common port; the first common port connects to a GND port; the first inductor and the first capacitor detect the change of the magnetic flux surrounding the electronic device and generate a first induced voltage; and the first induced voltage is outputted via the second common port.

10. The electronic device of claim 9, wherein the amplifier comprises an operational amplifier, a first resistance, a second resistance, and a second capacitor; the operational amplifier comprises a reverse input port, a positive input port, a positive power input port, a reverse power input port, and an output port; the first resistance connects to the second common port and the reverse input port; the second resistance connects to the reverse input port and the output port; the output port connects to the second capacitor; and the second capacitor connects to the GND port.

11. The electronic device of claim 10, wherein the control device comprises a second inductor, a zener diode, and a third capacitor; the third capacitor comprises a first port and a second port; the output port connects to the second inductor; the second inductor connects to a zener diode cathode; a zener diode anode connects to the first port; the third capacitor is configured to generate a control voltage, and the control voltage is the control signal.

12. The electronic device of claim 11, wherein the switch device comprises a FET and a third resistance; the FET comprises a gate port, a drain port, and a source port; the gate port connects to the second port; the source port connects to the third resistance; the third resistance connects to the GND port; the drain port connects to the electronic device; and the drain port and the source port are conducted in response to the control voltage.

13. The electronic device of claim 8, wherein the detecting device is a magnetic field sensor, or a Hall sensor.

14. The electronic device of claim 8, wherein the analog electronic signal is an analog voltage signal or an analog current signal.

* * * * *